United States Patent [19]

Spak et al.

[11] Patent Number: 5,922,503
[45] Date of Patent: Jul. 13, 1999

[54] PROCESS FOR OBTAINING A LIFT-OFF IMAGING PROFILE

[75] Inventors: Mark A. Spak, Edison; Ralph R. Dammel, Flemington; Michael Deprado, Raritan, all of N.J.

[73] Assignee: Clariant Finance (BVI) Limited, Virgin Islands (Br.)

[21] Appl. No.: 08/802,807

[22] Filed: Feb. 18, 1997

Related U.S. Application Data

[60] Provisional application No. 60/012,934, Mar. 6, 1996.
[51] Int. Cl.$^6$ .............................. G11B 7/24; G03C 5/00; G03C 1/492
[52] U.S. Cl. ............... 430/270.16; 430/269; 430/272.1
[58] Field of Search ........................ 430/270.16, 272.1, 430/269

[56] References Cited

U.S. PATENT DOCUMENTS

| | | | |
|---|---|---|---|
| 4,782,008 | 11/1988 | Babich et al. | 430/313 |
| 5,705,432 | 1/1998 | Lee et al. | 437/228 |

FOREIGN PATENT DOCUMENTS

| | | |
|---|---|---|
| 583205 | 2/1994 | European Pat. Off. . |
| 2221767 | 2/1990 | United Kingdom . |
| 9733199 | 12/1997 | WIPO . |

OTHER PUBLICATIONS

IEEE Transactions on Electron Devices, vol. 29, No. 5, May 1992, New York, pp. 834–837, XP002032671, Tadashi Serikawa: "The Size of Liftoff Metallization of Sputtered Aluminum Films".

Research Disclosure, No. 303, Jul. 1989, pg. 549 XP000045877 "Dry Lithographic Process".

Solid State Technology, vol. 26, Sept. 1983, Washington, pp. 174–176, XP002032672 S. J. Gillespie: "Top–edge Imaging in E–beam Lithography".

Microelectronic Engineering vol. 11, No. 1/04, Apr. 1990, pp. 549–552, XP000134655, Witman D F et al: "A Simple Bilayer Lift–off Process".

*Primary Examiner*—Susan A. Loring
*Attorney, Agent, or Firm*—Sangya Jain

[57] ABSTRACT

A process for obtaining a lift-off imaging profile which comprises the steps of:
  a) providing a first layer of plasma etchable material wherein said material has a film thickness less than about 0.5 $\mu$m (micrometer);
  b) providing a second layer comprising a photoimageable material on top of the first layer;
  c) forming a pattern in said second layer which comprises the steps of selectively exposing and developing the second layer;
  d) reacting the second layer with an organosilicon material; and
  e) etching the first layer isotropically in an oxygen atmosphere.

15 Claims, 1 Drawing Sheet

PROCESS FOR OBTAINING A LIFT-OFF IMAGING PROFILE

This application claims the benefit of U.S. Provisional Application No. 60/012,934 Mar. 6, 1996.

BACKGROUND ART

In the manufacture of patterned devices such as semiconductor chips and recording heads for hard drives, a crucial step is the deposition of metal with defined pattern onto a substrate. The accuracy and consistency with which this metal deposition process takes place is critical to the manufacturing yield and performance of the device. Several techniques are known for this metal deposition process, one of which is the lift-off process. In the lift-off process a photoresist pattern is defined on a substrate such that the areas where the metal is to be deposited contains no photoresist and the remaining parts of the substrate are protected by a layer of photoresist. However, in order for the photoresist to be removed after the deposition of metal a discontinuity is required in the metal film to allow for the removal of the resist by the photoresist stripper. Several lithographic processes are known to obtain the lift-off profile.

A lift-off photoresist profile is generally one that does not have a continuous perpendicular side-wall. The preferred photoresist side-wall is such that part of the substrate is protected from the deposition of metal. Typical types of lift-off profiles used in metal deposition are shown in FIG. I–III.

DESCRIPTION OF THE DRAWINGS

The profile in FIG. I is obtained by soaking the substrate with the imaged resist in chlorobenzene followed by development of the image. A protecting cap is formed on the surface of the resist. During metal deposition the protecting cap provides a discontinuity in the metal film that is deposited over the resist and the substrate, therefore allowing for the photoresist to be subsequently removed.

In FIG. II an undercut profile is obtaining by the image reversal process as described in U.S. Pat. No. 4,885,232 and U.S. Pat. No. 5,399,456 and incorporated herein by reference. The wider line width at the surface of the photoresist layer shadows the narrower photoresist line width at the substrate interface during metal deposition. Thus a space is formed between the metal film over the photoresist and on the substrate which allows for photoresist removal.

Figure 1:
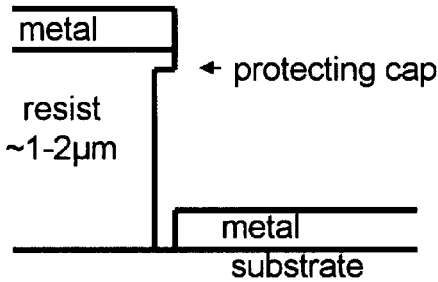
Figure 2:
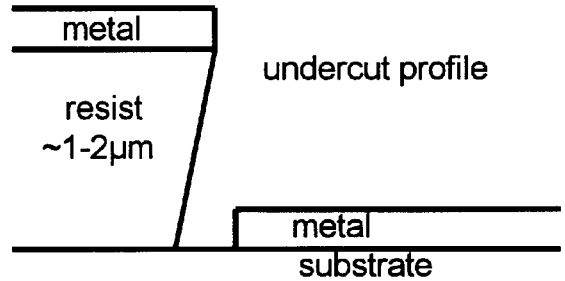
Figure 3:
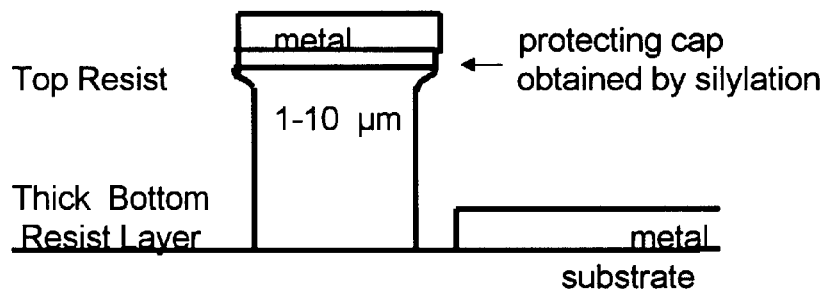
Figure 4:
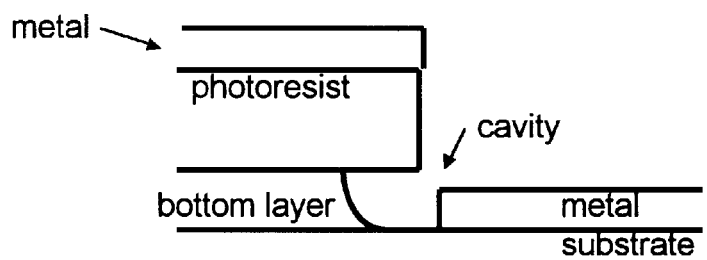

The lift-off scheme in FIG. III uses a bi-level process. A thick bottom layer of preimidized polyimide is formed on the substrate and a layer of diazo-type photoresist is used as the top layer. This top layer is imaged, developed and silylated as described in U.S. Pat. No. 4,782,008 and incorporated herein by reference. The bottom layer is etched away in a reactive ion etching oxygen system. The incorporation of silicon into the top layer during the silylation process makes the top layer resistant to etching while the bottom polyimide layer is being removed by the reative ion etching process. Thus, a top protective layer, which is wider at the top than at the substrate is formed. Upon metal deposition a space is formed between the photoresist and metal so that the photoresist can be removed.

FIG. IV sets forth a substrate having a cavity shaped profile in the bottom layer formed as a result of isotropic oxygen plasma etching.

The disadvantage of these types of lift-off profiles is that the protection to obtain the discontinuity on the substrate is at the top of the resist image and far removed from the substrate, so that due to the non-directionality of the metal deposition process, control of the metal line-width and its dimensions is decreased. In addition, metal deposition takes place on the side-walls of the photoresist and upon removal of the photoresist metal residues are left on the substrate. Ideally, the closer the discontinuity is to the final thickness of the metal layer the greater the control over the dimensionality of the metal structures. The cleanliness and increased control of any or all of the processing steps during the manufacture of integrated circuits adds greatly to the value of these processing steps.

SUMMARY OF INVENTION

The present invention describes a process for obtaining a lift-off photoresist profile that overcomes the disadvantages mentioned above.

The present invention comprises a process whereby a lift-off photoresist profile is obtained by imaging a bi-level system comprising a thin layer of a plasma etchable material coated onto a substrate with a film thickness less than about 0.5 $\mu$m(micrometer) and a second layer of photoimageable material coated on top of the bottom layer. The second layer is imaged, developed, and silylated using an organosilicon compound. Subsequently the bottom layer is anisotropically plasma etched in an oxygen atmosphere. An essential requirement of the bottom layer is that the thickness of this layer be only slightly greater than the thickness of the metal to be deposited, that is, the bottom layer have a thickness in the range of about 0.07 $\mu$m (micrometer) to about 0.5 $\mu$m (micrometer), preferably about 0.1 $\mu$m (micrometer) to about 0.3 $\mu$m (micrometer). In a preferred embodiment the thickness of the bottom layer is greater than the thickness of the metal layer by at least 0.1 $\mu$m (micrometer), preferably from about 0.1 to 0.4 $\mu$m (micrometer). Another requirement of the bottom layer is that it be etchable in oxygen plasma and further that it can not be silylated under the conditions in which the top photoresist is silylated. The bottom layer is preferably an organic antireflective coating. In a preferred embodiment the antireflective coating comprises an imide reation product of at least one aminoaromatic chromophore with a polymer comprising an anhydride. The second layer comprises an alkali-soluble resin and a photosensitive compound. In a preferred embodiment the second layer comprises a novolak resin and a reaction product of a diazonaphthoquinone and a polyhydroxyphenolic compound, and has a film thickness in the range of about 0.25 $\mu$m (micrometer) to about 1 $\mu$m (micrometer).

The photoresist layer is silylated according to techniques known in the art and an example of this is in U.S. Pat. No. 4,782,008. The silylation process causes silicon to be incorporated into only the surface and sidewalls of the top photoresist image. The silylation step is followed by isotropic oxygen plasma etching. This etching process removes the bottom layer in the areas where the top photoresist is not present. The incorporation of silicon into the photoresist during the silylation process prevents the oxygen plasma from etching the photoresist layer and therefore acts as a mask during plasma etching. Due to the isotropic etching of the bottom layer a cavity shaped profile is formed in the bottom layer. This cavity provides the needed discontinuous profile. Metal can then be deposited and the photoresist removed. Since the thickness of the cavity is very close to the thickness of the metal to be deposited a much greater dimensional control of the metal pattern is obtained, this control being very advantageous for the manufacture of electronic devices. Additionally, any metal deposited on the sidewalls of the photoresist is completely removed during the photoresist stripping process and no metal residues remain on the substrates.

DETAILED DEACRIPTION OF THE PREFERRED EMBODIMENT

The present invention provides a novel process for obtaining a lift-off imaging profile. The substrate is coated with a thin layer of polymeric material and is baked to substantially remove the solvent. A layer of photoresist is subsequently spun on top of the first layer and baked to substantially remove the solvent. The photoresist is exposed through a mask and the latent image is developed in the top layer. The imaged photoresist remaining on the substrate is then silylated. The silylating process incorporates silicon onto the surface and sidewalls of the photoresist. An essential requirement of the invention is that the composition of the first layer be such that it does not incorporate silicon during the silylation process and that it be rapidly etchable in oxygen plasma. Therefore, upon silylation of the photoresist, no silicon is incorporated into the first layer. The multilevel system is then etched in an isotropic oxygen plasma, which rapidly etches through the first layer while the silylated photoresist layer is very resistant to oxygen plasma etching. As a result of the isotropic etching, a cavity-shaped profile is formed in the bottom layer as shown in FIG. IV.

The formation of the cavity is a requirement of this invention and is desirable for several reasons. The cavity provides the discontinuity close to the substrate so that dimensional control of the metal layer is maximized. Additionally, the shape of the cavity allows for the photoresist remover to physically contact the bottom layer and function as a release layer to remove the resist. Another requirement is that the thickness of the metal is less than that of the first layer. Once the imaging of the bi-level system is complete, metal is deposited on the substrate and the photoresist removed.

The first layer of material coated onto the substrate is generally a thin layer with a thickness in the range of about 0.07 $\mu$m (micrometer) to about 0.5 $\mu$m (micrometer), preferably about 0.1 $\mu$m (micrometer) to about 0.3 $\mu$m (micrometer). The thickness of this layer must be greater than that of the metal to be deposited by at least 0.1 $\mu$m (micrometer). The composition of the first layer is determined by the property that it cannot be silylated under the conditions in which the top photoresist layer is silylated. Additionally, it must be etchable in oxygen plasma. Typically, the layer can be an organic anti-reflective coating such as described in EP 583,205. The anti-reflective coating described therein and incorporated by reference comprises a film forming composition comprising the imide reaction product of at least one aminoaromatic chromophore with a polymer comprising an anhydride. The aminoaromatic chromophore may be any aromatic compound having a primary or secondary amino moiety linked thereto and may be an N-aryl amino compound, a benzyl amine, or another aminoaromatic compound wherein the amino group is linked to the aromatic compound by means of an intermediate group. Preferred amino aromatic chromophores have a primary amino group. More preferred aminoaromatic chromophores have a primary amino group linked to the aromatic compound by means of a N-aryl bond. The most preferred aminoaromatic chromophores are selected from the group consisting of 1-aminoanthracene, 2-aminoanthracene, 1-aminonaphthalene, 2-aminonaphthalene, N-(2,4-dinitrophenyl)-1,4-benzenediamine, p-(2,4-dinitrophenylazo) aniline, p-(4-N,N-dimethylaminophenylazo)aniline, 4-amino-2-(9-(6-hydroxy-3-xanthenonyl)benzoic acid, 2,4-dinitrophenylhydrazine, dinitroaniline, aminobenzothiazoline, and aminofluorenone. Polymers useful for reacting with the aminoaromatic chromophore comprise any polymer having an anhydride group. Particular examples include, without limitation, polydimethyglutarimide, poly(maleic anhydride-co-methylmethacrylate), poly(maleic anhydride-co-vinylmethylether), poly(styrene-co-maleic anhydride), and poly(acrylicanhydride), and derivatives, copolymers and combinations thereof. Additionally, the first layer can be a non-absorbing non-aromatic polymer, such as polyacrylates and polyvinylacetates, amongst others and may contain additives such as dyes.

The photoresist solution used to spin coat the photoimageable layer on top of the first layer comprises an alkali-soluble, water insoluble film forming resin, a photosensitive compound and a solvent. Typical alkali-soluble resins are novolacs and polyhydoxystyrenes. Photosensitive compounds can be diazonaphthoquinones, onium salts, triazines and others. Solvents, such as propylene glycol mono-methyl ether acetate, cellosolve acetate, ethyl lactate, ethyl ethoxy proprionate, 2-heptanone or mixtures of solvents can be used. Additives can also be incorporated into the photoresist composition e.g. dyes, dissolution inhibitors, anti-striation additives, photospeed enhancers, photoresist stabilizers, etc. An essential requirement of the photoresist is that it can be silylated under a set of conditions such that this layer becomes significantly etch resistant in an oxygen plasma. The preferred thickness of the second layer is in the range of about 0.25 $\mu$m (micrometer) to about 1 $\mu$m (micrometer). More preferrably the thickness is in the range of about 0.3 $\mu$m (micrometer) to about 0.6 $\mu$m (micrometer).

Suitable substrates include silicon, aluminum, polymeric resins, silicon dioxide, doped silicon dioxide, silicon nitride, tantalum, copper, polysilicons, ceramics, aluminum/copper mixtures; gallium arsenide and other such group III/IV compounds.

Silylation of photoresist is known in the art. A process that can be used, but not limited to, is described in U.S. Pat No. 4,782,008. The imaged photoresist pattern is soaked in a solution of hexamethylcyclotrisilazane and xylene. The temperature of the solution and the length of soaking time effect the rate and extent of silylation. The longer the soaking time and the higher the temperature of the solution the greater the incorporation of silicon into the photoresist. Typical temperature used are in the range of about 20° C. to 100° C., preferably 35° C. to 80° C. Silylation times can range from about 30 seconds to 30 minutes, preferably one to fifteen minutes. Other silicon agents and solvents can also be used. Other silicon containing compounds that can be used are octamethylcyclotetrasilazane, 1.3-dichlorodimethyl diphenyldisiloxane, 1,7-dichlorooctamethyltetrasiloxane and hexamethyldisilazane. The preferred solvents are ones that dissolve the silicon containing compound, are non-reactive with this compound, are aprotic, and do not attack or dissolve the bottom layer. Typical organic solvents are benzene, toluene, xylene, ethers, and acetates.

An optional step of flood exposing the photoresist film prior to silylation can be incorporated in the present invention. Flood exposure is carried out by ultraviolet light, specifically ultraviolet light that will photolyse the photosensitive compound present in the photoresist composition.

After silylation, the composite is placed in a reaction chamber which is evacuated and filled with oxygen. The pressure in the reaction chamber is of the order of 10 militorr and the gas is introduced into the reaction chamber at a flow rate of about 0.02 liters per minute. A plasma is formed in the oxygen gas by coupling radio frequency power of about 0.02 kilowatts to the plasma and is continued for about 10–250 minutes. Other gases can be included in the reactive chamber, e.g. argon or other oxygen-inert gases or hydrocarbon gases. During the plasma etching process the bottom layer is etched rapidly whilst the top silylated photoresist layer remains essentially intact. At the conclusion of this processing step, a lift-off profile, with a cavity in the bottom layer is obtained, as is shown in FIG. IV.

Metal may then be deposited on the composite. The thickness of the deposited metal is less than the thickness of the bottom layer. The photoresist layer is then stripped with a chemical photoresist remover. When a chemical photoresist remover is used the solubility of the unsilylated bottom layer assists the ease and cleanliness of the photoresist removal process, thus providing the process of this invention with another important manufacturing advantage.

The following non-limiting examples are presented to illustrate the present invention.

EXAMPLE 1

To a solution of 16.1 grams of poly(vinylmethylether-maleic anhydride) and 469 grams cyclohexanone, 28.2 grams of N-(2,4-dinitrophenyl)-1,4-benzenediamine were added. The solution was heated at 140° C. for 4 hours. The complete imidization of the reaction was monitored by infrared spectroscopy. The solution was adjusted to give an antireflective coating formulation with 9% solids by weight.

EXAMPLE 2

The antireflective coating from Example 1 was applied to a silicon wafer by spin coating at 3000 rpm. The coating was baked at 170° C. for 60 seconds on a hot plate. A coating thickness of 0.25 μm (micrometer) was obtained. Subsequently, a layer of AZ® 1505 resist(a diazonaphthoquinone-novolak resist available from Hoechst Celanese Corporation, AZ Photoresist Products), was coated over the antireflective coating at 4000 rpm and baked at 110° C. for 60 seconds on a hotplate to give a coating of 0.5 μm (micrometer). The second layer was exposed through a mask using an exposure dose of 100 mJ/cm sq. and developed using AZ® 400K Developer (potasium hydroxide solution available from Hoechst Celanese Corporation, AZ Photoresist Products) diluted 1:4 with water for 60 seconds. The photoresist was then flood exposed with 2,000 mJ/cm sq. of UV radiation from a mercury lamp. The substrate was soaked in a solution of 5% hexamethylcyclotrisilazane in xylene containing 0.5 vol % N-methylpyrollidone at 40° C. for 2 minutes and subsequently spun dried. Plasma etching of the first layer was carried in a plasma etcher using oxygen at a pressure of 6 torr, flow rate of 1,000 cubic cm/sec and power of 250 watts for 8 minutes to give an isotropic profile for the first layer.

What is claimed is:

1. A process for obtaining a lift-off imaging profile which comprises the steps of:
   a) providing a first layer of plasma etchable material wherein said material has a film thickness less than about 0.5 μm (micrometer);
   b) providing a second layer comprising a photoimageable material on top of the first layer;
   c) forming a pattern in said second layer which comprises the steps of selectively exposing and developing the second layer;
   d) reacting the second layer with an organosilicon material; and
   e) etching the first layer isotropically in an oxygen atmosphere.

2. The process according to claim 1 wherein the first layer comprises an organic antireflective coating.

3. The process according to claim 1 wherein the first layer comprises an imide reaction product of at least one aminoaromatic chromophore with a polymer comprising an anhydride.

4. The process according to claim 3 wherein the polymer comprising the anhydride is a copolymer comprising a first repeat unit having an anhydride group and a second repeat unit having an ethylene group with at least one substituent.

5. The process according to claim 3 wherein the aminoaromatic chromophore is selected from the group consisting of 1-aminoanthracene, 2-aminoanthracene, 1-aminonaphthalene, 2-aminonaphthalene, N-(2,4-dinitrophenyl)-1,4-benzenediamine, p-(2,4-dinitrophenylazo) aniline, p-(4-N,N-dimethylaminophenylazo)aniline, 4-amino-2-(9-(6-hydroxy-3-xanthenonyl))-benzoic acid, 2,4-dinitrophenylhydrazine, dinitroaniline, aminobenzothiazoline, and aminofluorenone.

6. The process according to claim 1 wherein the second layer comprises an alkali-soluble, water insoluble, film-forming resin and a photosensitive compound.

7. The process according to claim 6 wherein a dissolution inhibitor capable of decomposition in the presence of an acid is further incorporated into the second layer.

8. The process according to claim 1 wherein the polymer is a novolak resin or a hyroxystyrene polymer.

9. The process according to claim 6 wherein the photosensitive compound is selected from the group consisting of diazonaphthaquinones, onium salts and triazines.

10. The process according to claim 9 wherein the diazonphthaquinone further comprises a reaction product of 2.1.5, 2.1.4, or 2.1.6 diazonaphthoquinone or mixtures thereof, with tri- or tetrahydroxybenzophenone or trishydroxyphenylalkanes, or mixtures thereof.

11. The process according to claim 1 wherein the thickness of the second layer is in the range of about 0.25 μm (micrometer) to about 1 μm (micrometer).

12. The process according to claim 1 wherein the exposing radiation is in the range of about 200 nanometers to 450 nanometers.

13. The process according to claim 1 wherein the developing step uses an aqueous solution of tetramethylammonium hydroxide.

14. The process according to claim 1 wherein the organosilicon material is selected from the group consisting of hexamethylcyclotrisilazane, octamethylcyclotetrasilazane, 1.3-dichlorodimethyl diphenyldisiloxane, 1,7-dichlorooctamethyltetrasiloxane and hexamethyidisilazane.

15. The process according to claim 1 wherein a step of flood exposing the second layer prior to reacting said second layer with an organosilicon compound is incorporated into the process.

* * * * *